United States Patent
Cruzan et al.

(10) Patent No.: US 11,656,273 B1
(45) Date of Patent: May 23, 2023

(54) HIGH CURRENT DEVICE TESTING APPARATUS AND SYSTEMS

(71) Applicant: Advantest Test Solutions, Inc., San Jose, CA (US)

(72) Inventors: Gregory Cruzan, San Jose, CA (US); Karthik Ranganathan, San Jose, CA (US); Mohammad Ghazvini, San Jose, CA (US); Paul Ferrari, San Jose, CA (US); Samer Kabbani, San Jose, CA (US); Todd Berk, San Jose, CA (US)

(73) Assignee: Advantest Test Solutions, Inc., San Jose, CA (US)

( * ) Notice: Subject to any disclaimer, the term of this patent is extended or adjusted under 35 U.S.C. 154(b) by 0 days.

(21) Appl. No.: 17/520,202

(22) Filed: Nov. 5, 2021

(51) Int. Cl.
*G01R 31/28* (2006.01)

(52) U.S. Cl.
CPC ..... *G01R 31/2877* (2013.01); *G01R 31/2879* (2013.01)

(58) Field of Classification Search
CPC ............ G01R 31/2874; G01R 31/2875; G01R 31/2877
See application file for complete search history.

(56) References Cited

U.S. PATENT DOCUMENTS

| | | | |
|---|---|---|---|
| 5,126,656 A | 6/1992 | Jones | |
| 5,164,661 A | 11/1992 | Jones | |
| 5,239,093 A | 8/1993 | Cheng | |
| 5,315,240 A | 5/1994 | Jones | |
| 5,420,521 A | 5/1995 | Jones | |
| 5,821,505 A | 10/1998 | Tustaniwskyj et al. | |
| 6,184,504 B1 | 2/2001 | Cardella | |
| 6,359,264 B1 | 3/2002 | Schaper et al. | |
| 6,389,225 B1 | 5/2002 | Malinoski et al. | |
| 6,498,899 B2 | 12/2002 | Malinoski et al. | |
| 6,515,470 B2 | 2/2003 | Suzuki et al. | |
| 6,668,570 B2 | 12/2003 | Wall et al. | |
| 6,711,904 B1 | 3/2004 | Law et al. | |
| 6,825,681 B2 | 11/2004 | Feder et al. | |
| 6,862,405 B2 | 3/2005 | Malinoski et al. | |
| 6,985,000 B2 | 1/2006 | Feder et al. | |
| 7,042,240 B2 | 5/2006 | Lopez et al. | |
| 7,138,811 B1 * | 11/2006 | Mahoney | G01R 31/2889 324/762.02 |

(Continued)

FOREIGN PATENT DOCUMENTS

| | | |
|---|---|---|
| CN | 101073016 A | 11/2007 |
| CN | 103038751 A | 4/2013 |

(Continued)

OTHER PUBLICATIONS

Ranganathan et al. D517: Shielded Socket and Carrier for High-Volume Test of Semiconductor Devices; Powerpoint; 12 pp. Sep. 30, 2021.

*Primary Examiner* — Tung X Nguyen

(57) ABSTRACT

Embodiments of the present invention provide systems and methods for performing automated device testing at high power using ATI-based thermal management that substantially mitigates or prevents the pads and pins thereof from being burned or damaged. In this way, the lifespan of the testing equipment is improved and the expected downtime of testing equipment is substantially reduced, while also reducing cost of operation.

26 Claims, 17 Drawing Sheets

(56) References Cited

U.S. PATENT DOCUMENTS

| | | |
|---|---|---|
| 7,151,388 B2 | 12/2006 | Gopal et al. |
| 7,311,782 B2 | 12/2007 | Strang et al. |
| 7,355,428 B2 | 4/2008 | Kabbani et al. |
| 7,411,792 B2 | 8/2008 | Richards et al. |
| 7,436,059 B1 | 10/2008 | Ouyang |
| 7,519,880 B1 | 4/2009 | Johnson et al. |
| 7,626,407 B2 | 12/2009 | Kabbani |
| 7,659,738 B2 | 2/2010 | Hong |
| 7,726,145 B2 | 6/2010 | Nakamura |
| 7,755,899 B2 | 7/2010 | Stenmark |
| 7,781,883 B2 | 8/2010 | Sri-Jayantha et al. |
| 7,830,164 B2 | 11/2010 | Earle et al. |
| 7,848,106 B2 | 12/2010 | Merrow |
| 8,343,280 B2 | 1/2013 | Iimuro |
| 8,552,540 B2 | 10/2013 | Warren et al. |
| 8,558,540 B2 | 10/2013 | Warren et al. |
| 8,772,682 B2 | 7/2014 | Ambal et al. |
| 8,927,907 B2 | 1/2015 | Fink et al. |
| 8,970,244 B2 | 3/2015 | Di Stefano et al. |
| 9,080,820 B2 | 7/2015 | Bolton |
| 9,291,667 B2 | 3/2016 | Armstrong et al. |
| 9,307,578 B2 | 4/2016 | Pease |
| 9,310,145 B2 | 4/2016 | Colongo et al. |
| 9,414,526 B2 | 8/2016 | Mann et al. |
| 9,494,353 B2 | 11/2016 | Yu et al. |
| 9,594,113 B2 | 3/2017 | Davis et al. |
| 9,766,287 B2 | 9/2017 | Narasaki et al. |
| 9,841,772 B2 | 12/2017 | Bucher |
| 10,056,225 B2 | 8/2018 | Gaff et al. |
| 10,126,356 B2 | 11/2018 | Barabi et al. |
| 10,163,668 B2 | 12/2018 | Steinhauser |
| 10,354,785 B2 | 7/2019 | Yamaguchi et al. |
| 10,656,200 B2 | 5/2020 | Cruzan et al. |
| 10,775,408 B2 | 9/2020 | Carvalho et al. |
| 10,908,207 B2 | 2/2021 | Barabi et al. |
| 10,955,466 B2 | 3/2021 | Tsai et al. |
| 10,983,145 B2 | 4/2021 | Akers et al. |
| 11,143,697 B2 | 10/2021 | Wolff |
| 2002/0026258 A1 | 2/2002 | Suzuki et al. |
| 2002/0118032 A1 | 8/2002 | Norris et al. |
| 2003/0155939 A1 | 8/2003 | Lutz et al. |
| 2004/0017185 A1 | 1/2004 | Song et al. |
| 2005/0026476 A1 | 2/2005 | Mok et al. |
| 2005/0086948 A1 | 4/2005 | Milke-Rojo et al. |
| 2005/0103034 A1 | 5/2005 | Hamilton et al. |
| 2005/0151553 A1 | 7/2005 | Kabbani et al. |
| 2006/0158207 A1 | 7/2006 | Reitinger |
| 2006/0290370 A1 | 12/2006 | Lopez |
| 2009/0160472 A1 | 6/2009 | Segawa et al. |
| 2009/0218087 A1 | 9/2009 | Oshima |
| 2010/0042355 A1 | 2/2010 | Aube et al. |
| 2011/0050268 A1 | 3/2011 | Co et al. |
| 2011/0074080 A1 | 3/2011 | DiStefano et al. |
| 2013/0181576 A1 | 7/2013 | Shiozawa et al. |
| 2013/0285686 A1 | 10/2013 | Malik et al. |
| 2014/0035715 A1 | 2/2014 | Takahashi et al. |
| 2014/0251214 A1 | 9/2014 | Cuvalc et al. |
| 2015/0028912 A1 | 1/2015 | Cho et al. |
| 2015/0137842 A1 | 5/2015 | Murakami et al. |
| 2015/0226794 A1 | 8/2015 | Chen |
| 2016/0084880 A1 | 3/2016 | LoCiccero et al. |
| 2016/0247552 A1 | 8/2016 | Kim et al. |
| 2016/0351526 A1 | 12/2016 | Boyd et al. |
| 2017/0102409 A1 | 4/2017 | Sarhad et al. |
| 2018/0024188 A1 | 1/2018 | Cruzan et al. |
| 2018/0189159 A1 | 7/2018 | Carmichael et al. |
| 2018/0218926 A1 | 8/2018 | Stuckey et al. |
| 2019/0064254 A1 | 2/2019 | Bowyer et al. |
| 2019/0162777 A1 | 5/2019 | Chiang et al. |
| 2019/0271719 A1 | 9/2019 | Sterzbach |
| 2019/0310314 A1 | 10/2019 | Liu et al. |
| 2019/0346482 A1 | 11/2019 | Kiyokawa et al. |
| 2020/0041564 A1 | 2/2020 | Cojocneanu |
| 2020/0363104 A1 | 11/2020 | MacDonald et al. |
| 2020/0371155 A1 | 11/2020 | Walczyk et al. |
| 2021/0071917 A1 | 3/2021 | Pei et al. |
| 2021/0183668 A1 | 6/2021 | Cagle et al. |
| 2021/0293495 A1 | 9/2021 | Barako et al. |
| 2021/0396801 A1 | 12/2021 | Ranganathan et al. |
| 2022/0044084 A1 | 2/2022 | Cardy |
| 2022/0082587 A1 | 3/2022 | Gopal et al. |
| 2022/0137092 A1 | 5/2022 | Ranganathan et al. |
| 2022/0137129 A1 | 5/2022 | Ranganathan et al. |
| 2022/0206061 A1* | 6/2022 | Ranganathan ......... G05B 15/02 |

FOREIGN PATENT DOCUMENTS

| | | |
|---|---|---|
| CN | 105144114 A | 12/2015 |
| CN | 109716513 A | 5/2019 |
| CN | 110214270 A | 9/2019 |
| CN | 110618903 A | 12/2019 |
| EP | 3270261 A1 | 1/2018 |
| JP | 2005156172 A | 6/2005 |
| JP | 2008275512 A | 11/2008 |
| TW | 446682 B | 7/2001 |
| TW | 200535440 A | 11/2005 |
| TW | 200620596 A | 6/2006 |
| TW | 200628818 A | 8/2006 |
| TW | 201226579 A | 7/2012 |
| TW | 201229535 A | 7/2012 |
| TW | 201323883 A | 6/2013 |
| TW | 201504647 A | 7/2013 |
| TW | 201333497 A | 8/2013 |
| TW | 201447325 A | 12/2014 |
| TW | 201636618 A | 12/2014 |
| TW | 201608254 A | 3/2016 |
| TW | 201712459 A | 4/2017 |
| TW | 201834134 A | 9/2018 |
| TW | 201840996 A | 11/2018 |
| TW | I651540 B | 2/2019 |
| TW | 202004980 A | 1/2020 |
| TW | 202043787 A | 12/2020 |
| WO | 2016122039 A1 | 8/2016 |
| WO | 2017015052 A1 | 1/2017 |
| WO | 2017039936 A1 | 3/2017 |
| WO | 2017112076 A1 | 6/2017 |
| WO | 2020159954 A1 | 8/2020 |

\* cited by examiner

HIGH CURRENT DEVICE TESTING APPARATUS AND SYSTEMS

FIELD

Embodiments of the present invention generally relate to the field of device testing. More specifically, embodiments of the present invention relate to apparatus and systems for automated testing systems using an active thermal interposer (ATI).

BACKGROUND

A device under test (e.g., a DUT) is typically tested to determine the performance and consistency of the device before the device is sold. The DUT can be tested using a large variety of test cases, and the results of the test cases are compared to an expected output result. When the result of a test case does not match the expected output value, debugging is performed in an attempt to identify and correct any defects that result from the device and/or to bin the device based on performance and/or reject the device.

A DUT is usually tested by automatic or automated test equipment (ATE), which may be used to conduct complex testing using software and automation to improve the efficiency of testing. The DUT may be a memory device or component that is intended to be integrated into a final product, such as a computer or other electronic device. Typically, the end result of a test is either "pass" if the device successfully provides certain expected responses within pre-established tolerances, or "fail" if the device does not provide the expected responses within the pre-established tolerances. More sophisticated ATE systems are capable of evaluating a failed device to potentially determine one or more causes of the failure. Other ATE systems can categorize a performance of a device for binning purposes.

Typical tester systems require specifications to be set and rendered permanent ahead of time, e.g., maximum heating and maximum cooling specifications need to be "frozen." ATEs with active thermal imposers (ATIs) have been introduced that include discrete thermal interposers to heat or cool each DUT so that cooling specifications do not need to be frozen ahead of time. According to some embodiments, the heating and cooling abilities are incorporated into the thermal interposer itself. Examples of such tester systems are disclosed in copending U.S. patent application Ser. No. 16/986,037 and filed Aug. 5, 2020 by Ranganathan et al. The contents of such application are incorporated herein by reference.

One challenge of existing ATI-based active thermal control solutions is handling the relatively high current transmitted between the power pins of the thermal head and the pads of the ATI that contact the power pins. During testing of a DUT, the ATI pads are electrically coupled with the pins of the thermal head, and the ATIs can have multiple zones that can necessitate multiple voltage/current loops across the different zones. The heaters are typically ceramic heaters made of high temperature co-fired ceramic (HTCC). Other implementations use cartridge heaters with slower response times or low temperature co-fired ceramic (LTCC) heaters for low power testing.

An ATI needs to be easily and reliably connected to power during automated testing. One known method of supplying power for an ATI uses a pogo pin on the thermal head and a pad on the ATI to provide power during device testing. In operation, the thermal head engages the ATI using linear actuation in a direction toward the ATI. Other implementations use parallel socket actuation, where the ATI is attached to a structure comprising electrical contacts powered through the board.

Using ATI-based active thermal control solutions require high power to perform thermal testing on certain DUTs. For example, a typical ATI can carry up to 1100 watts of power at 110 volts with more than 10 amps of current. Other implementations can modulate the voltage from 24V DC to 220V DC or can include AC power supplies. The power of the ATI is typically modulated using pulse width modulation (PWM) to selectively turn the heat on or off.

However, it is currently not possible to transmit high power between the pins of the thermal head and the ATI pads without quickly damaging the ATI pads and/or the pins. The pads typically provide electrical connection to the internal electronics of the ATI, including the Heater Traces, the Resistance Temperature Detector (RTD) Traces, and the ground shield. When subjected to 110V and a high current of the order of 10 A, burn marks are visible on pads after roughly 100 cycles of testing, and the testing system is rendered unusable as burnt pads on the ATI degrade (increase) contact resistance and eventually cause the pogo pin to burn out completely.

Unfortunately, replacing burnt pads on an ATI is extremely cumbersome as gold is plated directly on the tungsten filled using HTCC, and replacing the pogo pin in the thermal head is a technical and complicated process involving disassembly of the thermal head, which leads to prolonged downtime of the testing equipment to address these maintenance issues.

SUMMARY

What is needed is an approach to automated device testing using ATI-based thermal control that substantially mitigates or prevents or reduces the ATI pads or the pins of the thermal head from being burned during high power device testing. Accordingly, embodiments of the present invention provide systems and methods for performing automated device testing at high power using ATI-based thermal management that substantially mitigates or prevents the pads and pins thereof from being burned or damaged. In this way, the lifespan of the testing equipment is improved and the expected downtime of testing equipment is substantially reduced, while also reducing cost of operation.

According to an embodiment, an active thermal interposer (ATI) device for use in testing a device under test (DUT) is disclosed. The ATI device includes a body layer having a first surface and a second surface, wherein said first surface is operable to be disposed adjacent to a cold plate of a thermal head and wherein said second surface is operable to be disposed adjacent to said DUT during testing thereof, a plurality of heater elements disposed within said body layer, a plurality of recessed pads disposed within recesses of said first surface of said body layer and wherein said plurality of recessed pads are electrically coupled to said plurality of heater elements, and a plurality of copper discs disposed on top of, and in electrical contact with, said plurality of recessed pads within said recesses and aligned wherein said plurality of cooper discs remain recessed with respect to said first surface and wherein said plurality of copper discs is operable to contact a corresponding plurality of pins of said thermal head to receive driving electrical signals therefrom.

According to some embodiments, said plurality of heater elements comprise tungsten traces, said plurality of recessed pads are gold, said plurality of pins comprise pogo pins, said plurality of copper discs functions to spread out heat and current with respect to said plurality of recessed pads, and said body layer comprises ceramic material.

According to some embodiments, two or more copper discs of said plurality of copper discs are disposed on top of, and in electrical contact with, each recessed pad of said plurality of recessed pads and wherein said recesses are oval in shape.

According to some embodiments, one copper disc of said plurality of copper discs is disposed on top of, and in electrical contact with, each recessed pad of said plurality of recessed pads and wherein said recesses are circular in shape.

According to some embodiments, said plurality of copper discs are affixed to said plurality of recessed pads.

According to some embodiments, the copper discs are removeable.

According to some embodiments, said plurality of copper discs are soldered to said plurality of recessed pads.

According to some embodiments, said plurality of recessed pads are electrically coupled to said plurality of heater elements using a plurality of via connections and wherein said plurality of via connections comprise tungsten vias.

According to some embodiments, said heater elements comprise high temperature co-fired ceramic (HTCC).

According to a different embodiment, a thermal head for use in testing a device under test (DUT) that is in contact with an active thermal interposer (ATI) device is disclosed. The thermal head includes an exterior surface, a cold plate for cooling said ATI device when said ATI device is in physical contact with said exterior surface, wherein said ATI device comprises a plurality of recessed pads disposed within recesses of a surface of said ATI device and wherein further said plurality of recessed pads are electrically coupled to a plurality of heater elements of said ATI device, a plurality of pins disposed over said exterior surface and operable to make physical and electrical contact with said plurality of recessed pads when said ATI device is in said physical contact with said exterior surface, and wherein two or more pins of said plurality of pins correspond, respectively, to each pad of said plurality of recessed pads, and circuits operable to drive electrical signals over said plurality of pins to energize said plurality of heater elements, wherein each heater element of said plurality of heater elements is energized by a common electrical signal driven over at least two or more pins.

According to some embodiments, when said ATI device is in said physical contact with said exterior surface, each pad of said plurality of recessed pads makes physical and electrical contact with two or more pins of said plurality of pins.

According to some embodiments, said plurality of pins comprise pogo pins.

According to some embodiments, said plurality of heater elements comprises high temperature co-fired ceramic (HTCC).

According to one embodiment, a thermal head for use in testing a device under test (DUT) that is in contact with an active thermal interposer (ATI) device is disclosed. The thermal head includes an exterior surface comprising a mating electrical housing, a cold plate for cooling said ATI device when said ATI device is in physical contact with said exterior surface, wherein said ATI device comprises a plurality of recessed pads disposed within recesses of a surface of said ATI device and wherein further said plurality of recessed pads are electrically coupled to a plurality of heater elements of said ATI device, a removable pin assembly operable to be inserted within said mating electrical housing. The removable pin assembly includes a body, a card edge connector comprising a plurality of conductors and coupled to said body, and a plurality of pins disposed over a surface of said body, said plurality of pins electrically coupled to said plurality of conductors and operable to make physical and electrical contact with said plurality of recessed pads when said ATI device is in said physical contact with said exterior surface, and circuits operable to drive electrical signals over said plurality of conductors and said plurality of pins to energize said plurality of heater elements.

According to some embodiments, said plurality of pins comprise pogo pins.

According to some embodiments, when said removable pin assembly is inserted into said mating electrical housing, said plurality of pins extend from, and are disposed across, said exterior surface.

According to some embodiments, said removable pin assembly further comprises alignment and securing posts disposed on said body, said alignment and securing posts for aligning said removable pin assembly with, and securing said removable pin assembly to, said mating electrical housing.

According to some embodiments, said removable pin assembly is replaceable to replace damaged pins.

According to one embodiment, an active thermal interposer (ATI) device for use in testing a device under test (DUT) is disclosed. The ATI device includes a body layer having a first surface and a second surface, where the first surface is operable to be disposed adjacent to a cold plate of a thermal head and where the second surface is operable to be disposed adjacent to the DUT during testing thereof, a plurality of heater elements disposed within the body layer, a plurality of recessed pads disposed within recesses of the first surface of the body layer and where the plurality of recessed pads are electrically coupled to the plurality of heater elements and where further the plurality of recessed pads is operable to contact a corresponding plurality of pins of the thermal head to receive driving electrical signals therefrom, and a plurality of vias disposed within the body layer and operable to provide electrical coupling between the plurality of recessed pads and the plurality of heater elements, where each via of the plurality of vias makes an electrical coupling between a respective recessed pad of the plurality of pads and a respective heater element of the plurality of heater elements, and where the plurality of vias include copper vias.

According to some embodiments, the plurality of heater elements include tungsten traces, the plurality of recessed pads are gold, the plurality of pins include pogo pins, and the body layer includes ceramic material.

According to another embodiment, an active thermal interposer (ATI) device for use in testing a device under test (DUT) is disclosed. The ATI device includes a body layer having a first surface and a second surface, where the first surface is operable to be disposed adjacent to a cold plate of a thermal head and where the second surface is operable to be disposed adjacent to the DUT during testing thereof, a plurality of heater elements operable to heat the DUT, where the plurality of heater elements is disposed within the body layer, and a plurality of recessed pads disposed within recesses of the first surface of the body layer, where the plurality of recessed pads is electrically coupled to the plurality of heater elements, and where each heater element of the plurality of heater elements is coupled to two or more respective recessed pads of the plurality of recessed pads, and where further the plurality of recessed pads is operable to contact a corresponding plurality of pins of the thermal head to receive driving electrical signals therefrom.

According to some embodiments, the plurality of heater elements include tungsten traces, the plurality of recessed pads are gold, the plurality of pins include pogo pins, and the body layer includes ceramic material.

According to some embodiments, two or more respective pins of the plurality of pins drive each heater element of the plurality of heater elements with a common electrical signal as applied to two or more pads corresponding to the heater element.

According to a different embodiment, an ATI device for use in testing a device under test (DUT) is disclosed. The ATI device includes a body layer having a first surface and a second surface, where the first surface is operable to be disposed adjacent to a cold plate of a thermal head and where the second surface is operable to be disposed adjacent to the DUT during testing thereof, a plurality of heater elements disposed within the body layer and divided into a plurality of heater zones, where individual heater zones of the plurality of heater zones each include two or more heater elements of the plurality of heater elements, and a plurality of recessed pads disposed within recesses of the first surface of the body layer, where the plurality of recessed pads is electrically coupled to the plurality of heater elements, and where each heater element of the plurality of heater elements is coupled to at least one respective recessed pad of the plurality of recessed pads, and where further the plurality of recessed pads is operable to contact a corresponding plurality of pins of the thermal head to receive driving electrical signals therefrom and where the two or more heater elements of an individual heater zone are controlled by a same driving electrical signal of the driving electrical signals.

According to some embodiments, the plurality of heater elements include tungsten traces, the plurality of recessed pads are gold, the plurality of pins include pogo pins, and the body layer includes ceramic material.

According to some embodiments, two or more respective pins of the plurality of pins carry a common driving electrical signal of the driving electrical signals.

According to some embodiments, the common driving electrical signal carried by the two or more respective pins of the plurality of pins drive two or more heater elements of a same heater zone of the plurality of heater zones.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Figure 1:
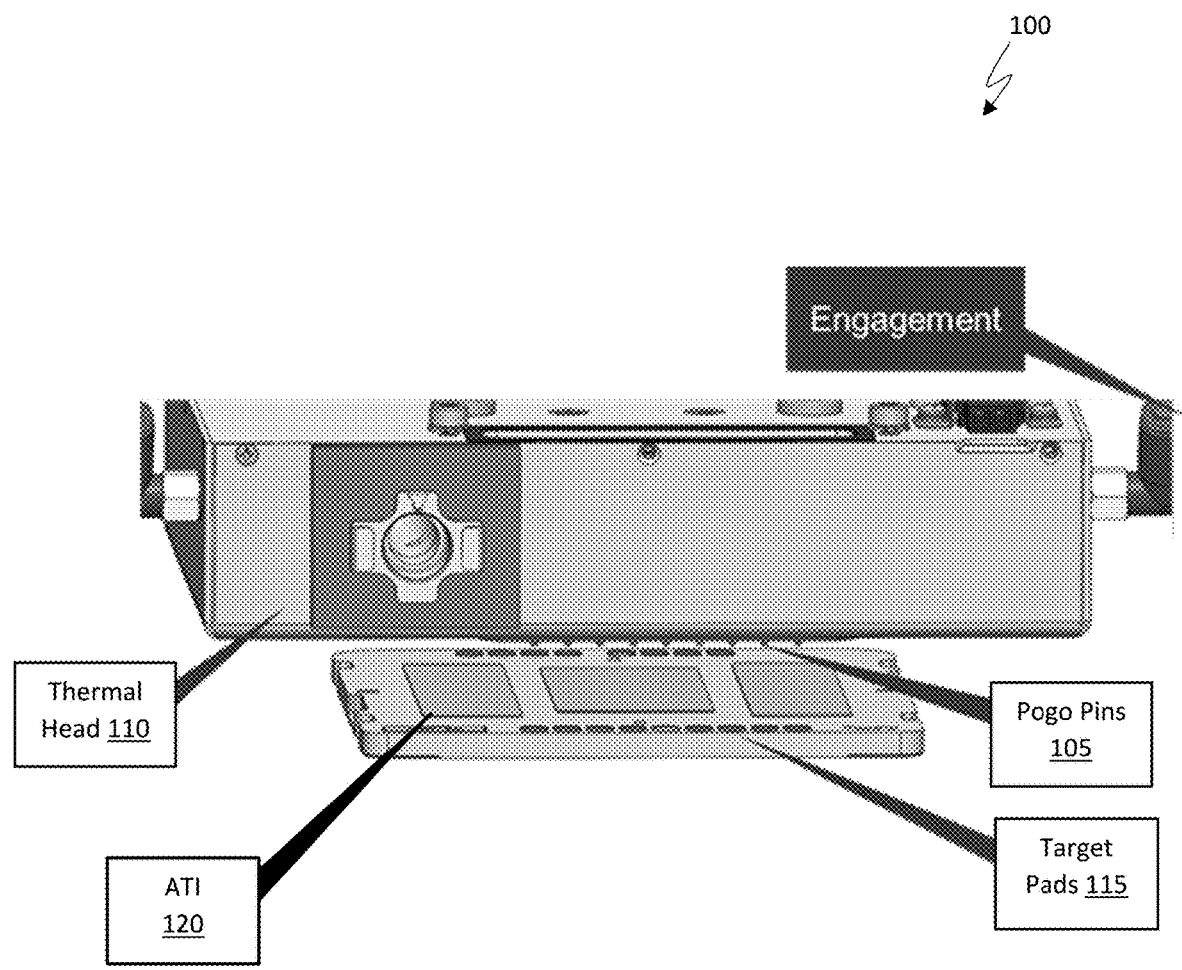
FIG. 1 depicts an exemplary ATI-based thermal management system for performing automated device testing.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in a figure herein describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "associating," "identifying," "encoding," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Some embodiments may be described in the general context of computer-executable instructions, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

High Current Device Testing Apparatus and Systems

Embodiments of the present invention provide systems and methods for performing automated device testing at high power using ATI-based thermal management that substantially mitigates or prevents the pads and pins thereof from being burned or damaged. In this way, the lifespan of the testing equipment is improved and the expected downtime of testing equipment is substantially reduced, while also reducing cost of operation.

FIG. 1 depicts an exemplary ATI-based thermal management system 100 for performing automated device testing.

The heaters of ATI 120 are typically ceramic heaters made using HTCC. ATI-based thermal management system 100 can carry up to 1100 watts of power at 110 volts carrying greater than 10 amps of current during high power device testing. According to some embodiments, the voltage can be modulated from 24V DC to 220V DC or using AC power supplies. The power is typically modulated using pulse width modulation to turn the heat on and off. ATI-based thermal management system 100 can include multiple zones multiple voltage/current loops spanning the zones.

As depicted in FIG. 1, exemplary ATI-based thermal management system 100 can be powered by electronically coupling pogo pins 105 of thermal head 110 with target pads 115 of ATI 120. As shown in FIG. 1, the DUT would be positioned under ATI 120. ATI 120 can be disposed on top of a DUT within a socket, for example, to heat the DUT during testing. In the example, of FIG. 1, a surface of thermal head 110 (e.g., a cold plate) engages ATI 120 using linear actuation in a direction toward ATI 120. Typically each pogo pin engages with a single target pad to provide power to the ATI for heating. According to other embodiments, the ATI-based thermal management system 100 is powered using an Integrated Test Cell with Active Thermal Interposer Parallel Socket Actuation as described in copending U.S. patent application Ser. No. 16/986,037 and filed Aug. 5, 2020 by Ranganathan et al. and incorporated herein by reference. In these embodiments, ATI 120 is attached to a superstructure including electrical contacts powered through the board. As described in more detail below, ATI-based thermal management system 100 in accordance with embodiments of the present invention is configured to substantially prevent or mitigate wear (e.g., burning) of pogo pins 105 and target pads 115 to reduce downtime of testing equipment and increase the longevity of thermal management system 100. During testing, a cold plate of the thermal head is brought into contact with ATI 120 and the ATI 120 heats the DUT.

Pogo pins 105 can include internal springs that exert force on the pads when the pins are brought into contact with a target ATI pad. For example, the pogo pins can be Smith Interconnect CP-2.5-6-SM-BB spring-loaded pogo pins. According to some embodiments, the pogo pins use a biased ball design to ensure that the majority of current does not pass through the internal spring. The heaters of ATI 120 can be ceramic heaters made from aluminum nitride and can include tungsten traces, for example. The vias that connect the traces to the pads are filled with tungsten and a gold pad is disposed on top of the traces in one embodiment. The gold pads can be recessed below the surface of the ceramic to ensure contact between the thermal head and the ATI. The target pads can take any suitable size and shape, such as oval or circular, for example.

Figure 2A:
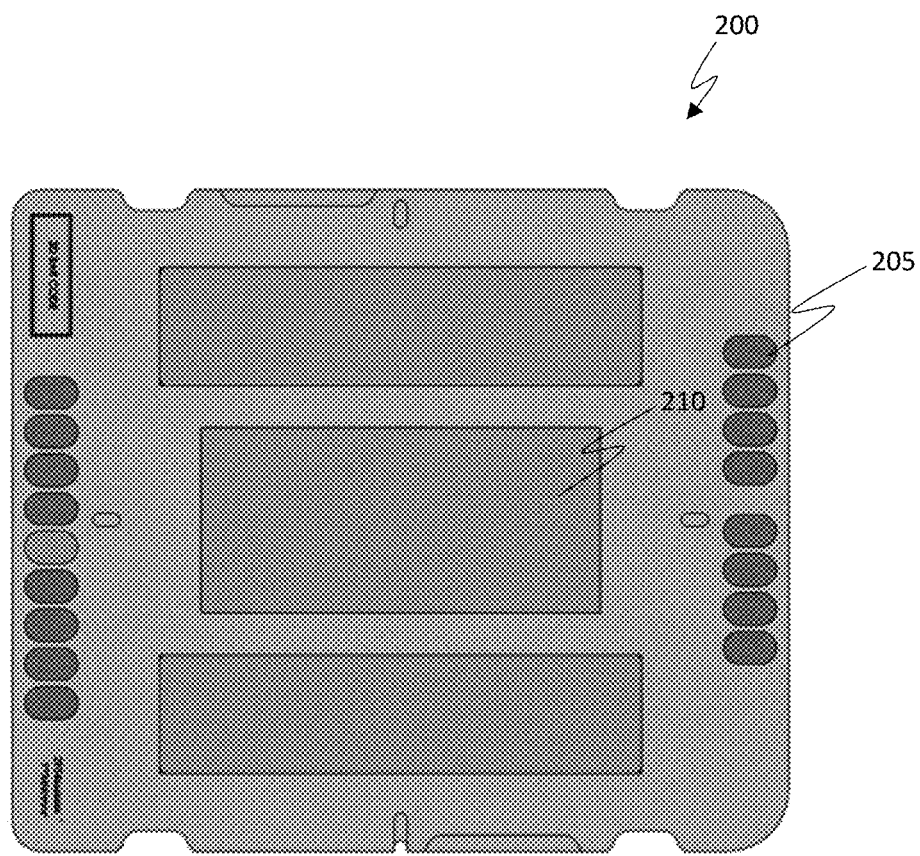
FIG. 2A depicts an exemplary ATI including target pads operable to be electrically coupled to pogo pins of a thermal head to provide power to an ATI-based thermal interface for automated device testing.
Figure 2B:
FIG. 2B shows damage to target pads of an ATI caused by high power device testing.
Figure 2C:
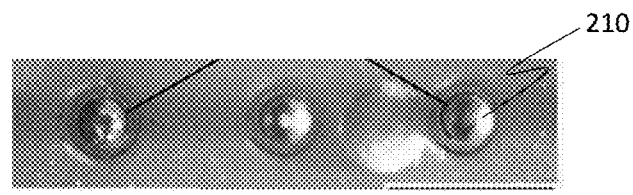
FIG. 2C shows damage to pogo pins of a thermal head that contact target pads of an ATI caused by high power device testing.

FIG. 2A depicts a plan view an exemplary ATI 200 including target pads 205 operable to be electrically coupled to pogo pins of a thermal head to provide power to ATI 200 for automated device testing. In the example of FIG. 2A, the target pads 205 are susceptible to damage during high power testing when coupled to pins of a thermal head for high power testing. In the center of the ATI are shown three heater zones 210. FIGS. 2B and 2C show damage to target pads 205 and the pogo pins 210 of a thermal head that contact target pads 205, respectively, caused by high power device testing. Accordingly, embodiments of the present invention provide an approach to high power automated device testing that substantially mitigates or prevents burning to ATI pads and pins to improve the longevity of the test equipment and reduce operating cost.

Figure 3A:
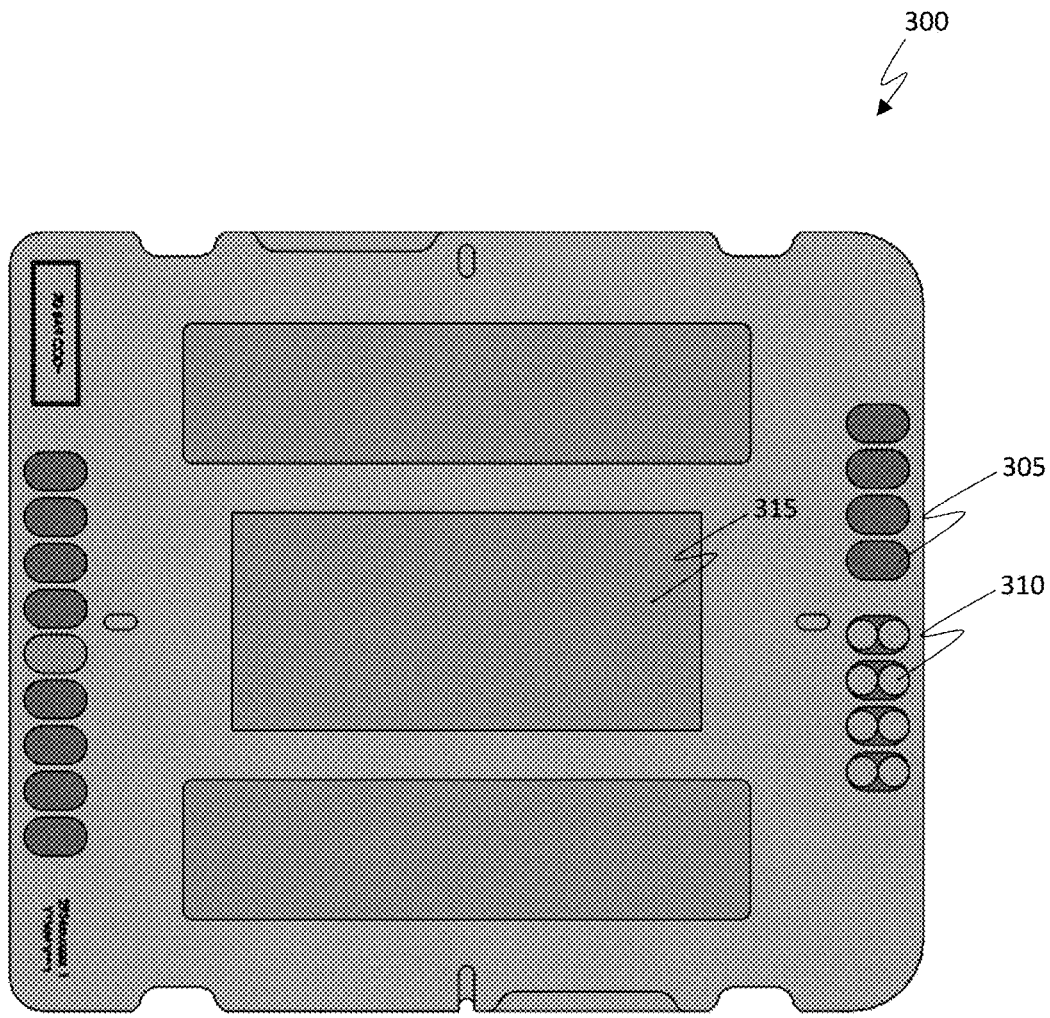
FIG. 3A depicts an exemplary ATI including target pads operable to be electrically coupled to pogo pins of a thermal head to provide power to an ATI-based thermal interface for automated device testing while substantially preventing damage of the pins and pads according to embodiments of the present invention.

FIG. 3A depicts a plan view of an exemplary ATI 300 including target pads 305 operable to be electrically coupled to pogo pins of a thermal head to power heaters of ATI 300 during automated device testing of a DUT while substantially preventing damage (e.g., burning) of the pins and pads according to embodiments of the present invention. As depicted in FIG. 3A, ATI 300 includes recessed target pads 305 having two target pad discs 310 per target pad. The target pad discs 310 can be soldered directly to the target pads 305 or otherwise affixed (e.g., removably affixed) to the pads to spread out heat and current during testing. The target pad discs 310 are larger than the tip of a corresponding pin. According to some embodiments, target pad discs 310 are added to the target pads having the highest current carrying heater connections. Heater zones 315 are also shown.

The use of target pad discs 310 substantially reduces the rate of burning and increases the amount of time that pogo pins can be electrically coupled to the target pads for high power testing. Moreover, target pad discs 310 can be readily replaced periodically (e.g., every few months) as part of the maintenance cycle of the testing equipment and the ATI thermal insulation material (TIM) can be replaced at the same time. In this way, target pad discs 310 can be replaced before damage occurs to target pads 305. According to some embodiments, the discs are mode of copper or a similar material and can be plated in gold. The target disc pads can be removed during maintenance. The surface mount flat contact pad part number S70-332002045R produced by Harwin Inc is an example of a suitable target disc pad.

Figure 3B:
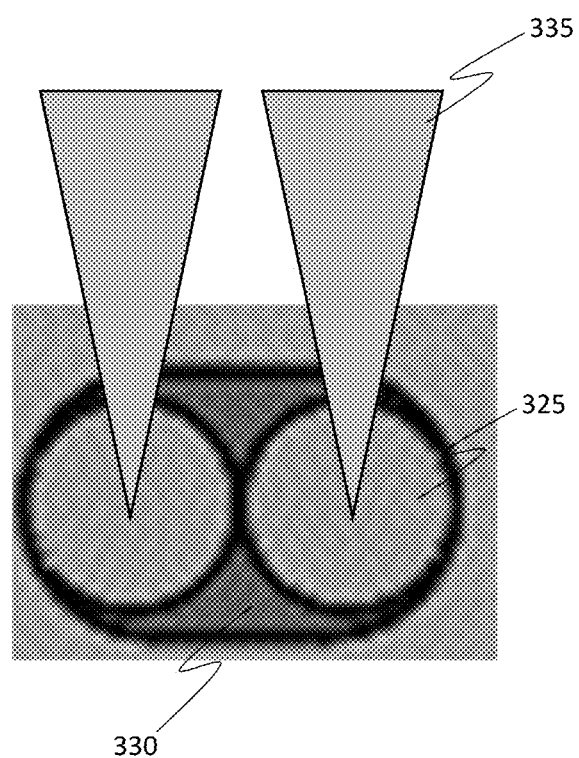
FIG. 3B depicts exemplary ATI target pad discs electrically coupled to pogo pins of a thermal head to provide power to an ATI-based thermal interface for automated device testing using two pins and two discs per pad per according to embodiments of the present invention.

FIG. 3B depicts an expanded view of the contact between target pad discs 330 and corresponding pins 335 (e.g., pogo pins of a thermal head) according to embodiments of the present invention. As depicted in FIG. 3B, each target pad 330 includes two target pad discs 325, and each target pad disc 325 is contacted by a corresponding pin 335 and a common drive signal is carried over both pins 335. Target pad discs 325 substantially reduce the rate of burning and increase the amount of time that pins 335 can be electrically coupled to the target pad 330 for high power testing by spreading out the current to the pad. According to some embodiments, each pin and pad receive approximately half of the current compared to a single pin implementation.

Figure 3C:
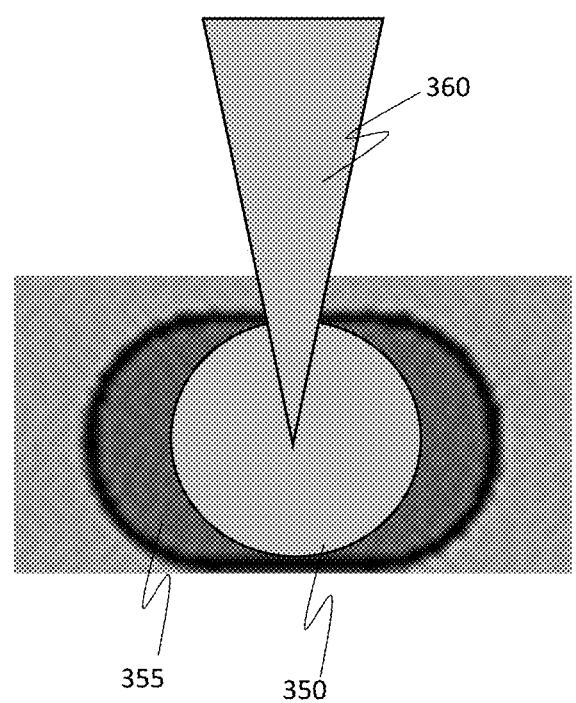
FIG. 3C depicts exemplary ATI target pad discs electrically coupled to pogo pins of a thermal head to provide power to an ATI-based thermal interface for automated device testing using one pin and one disc per pad per according to embodiments of the present invention.

FIG. 3C depicts an expanded view of the contact between target pad disc 350 and corresponding pin 360 (e.g., a pogo pin of a thermal head) according to embodiments of the present invention. As depicted in FIG. 3C, each target pad 355 includes one target pad disc 350, and each target pad disc 350 is contacted by a corresponding pin 360. Target pad disc 350 substantially reduces the rate of burning and increases the amount of time that pin 360 can be electrically coupled to the target pads for high power testing by spreading the current out over the pad.

Figure 4A:
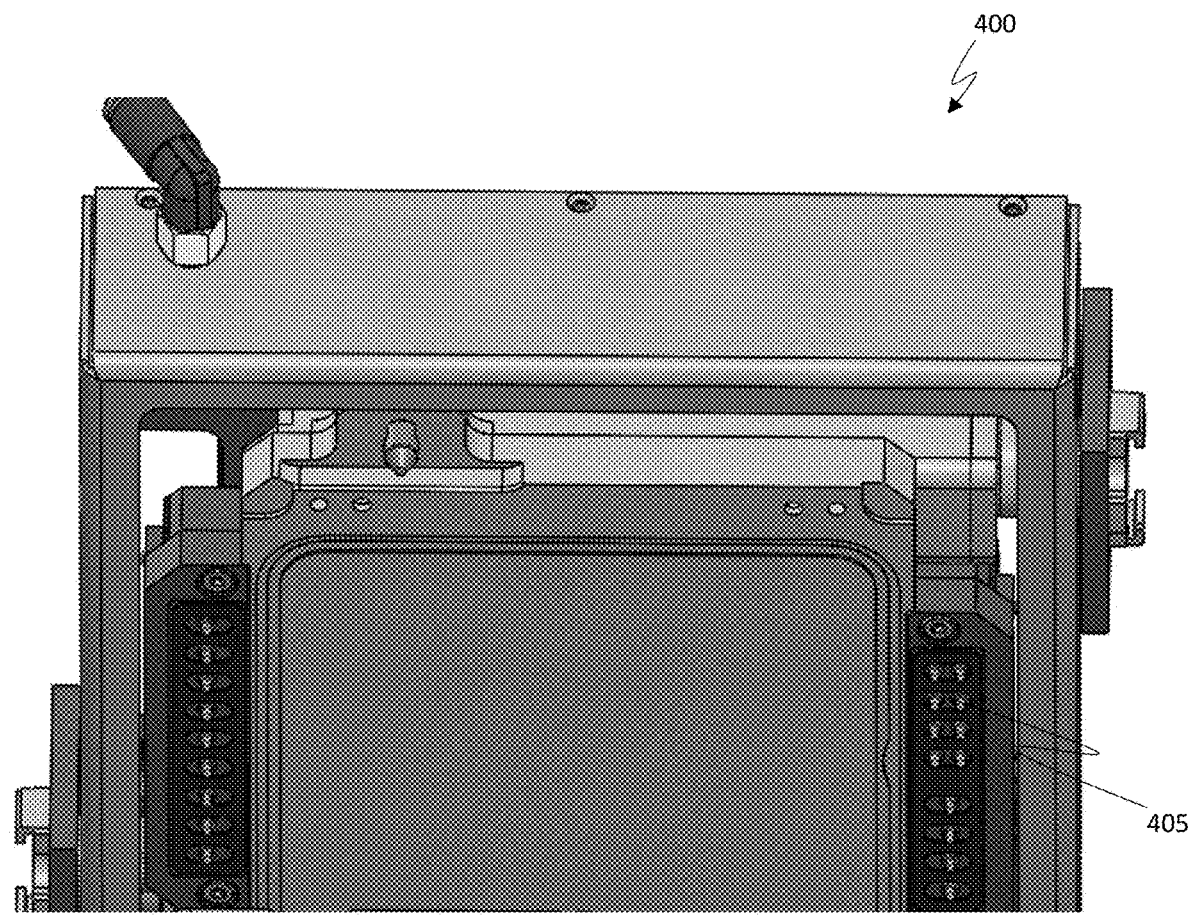
FIG. 4A depicts an exemplary thermal head with dual pins used to power heaters of an ATI for heating a device under test according to embodiments of the present invention.

FIG. 4A depicts an exemplary thermal head 400 with dual pins 405 used to power heaters of an ATI for heating a device under test according to embodiments of the present invention. The two rows of pogo pins 405 are electrically coupled to recessed pads of the ATI to reduce the amount of current through each individual heater power connection, thereby reducing burn and wear on the pogo pins and the ATI pads during testing. According to some embodiments, each pin and pad receive approximately half of the current compared to a single pin implementation.

Figure 4B:
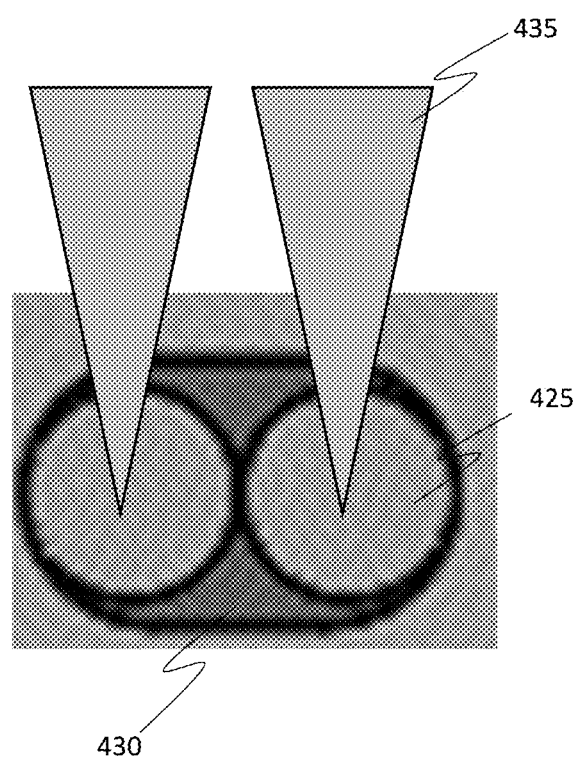
FIG. 4B depicts exemplary pins of a thermal head electrically coupled to ATI target pads to provide power to an ATI-based thermal interface for automated device testing using two pins and two discs per pad per according to embodiments of the present invention.

FIG. 4B depicts a close view of the contact between target pad discs 425 and corresponding pins 435 (e.g., pogo pins of a thermal head) according to embodiments of the present invention. As depicted in FIG. 4B, each target pad 430 includes two target pad discs 425, and each target pad disc 425 is contacted by a corresponding pin 435. Target pad discs 425 substantially reduce the rate of burning and increases the amount of time that pins 435 can be electrically coupled to target pad 430 for high power testing. According to some embodiments, each pin and pad receive approximately half of the current compared to a single pin implementation.

Figure 4C:
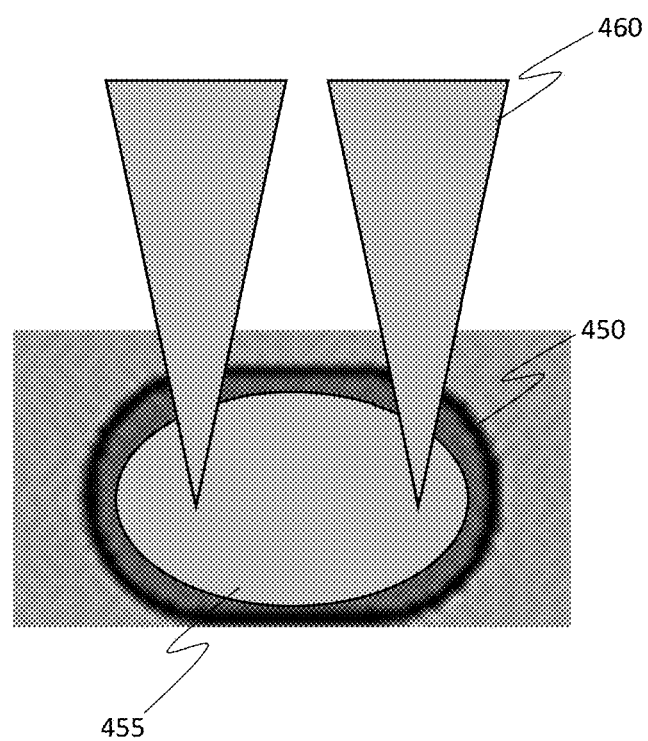
FIG. 4C depicts exemplary ATI target pad discs electrically coupled to pogo pins of a thermal head to provide power to an ATI-based thermal interface for automated device testing using one pin and one disc per pad per according to embodiments of the present invention.

FIG. 4C depicts a close view of the contact between target pad discs 450 and corresponding pins 460 (e.g., pogo pins of a thermal head) according to embodiments of the present invention. As depicted in FIG. 4C, each target pad 450 includes one target pad disc 455, and each target pad disc 455 is contacted by two corresponding pins 460. Target pad disc 455 substantially reduces the rate of burning and increases the amount of time that pins 460 can be electrically coupled to target pad 450 for high power testing.

Figure 5:
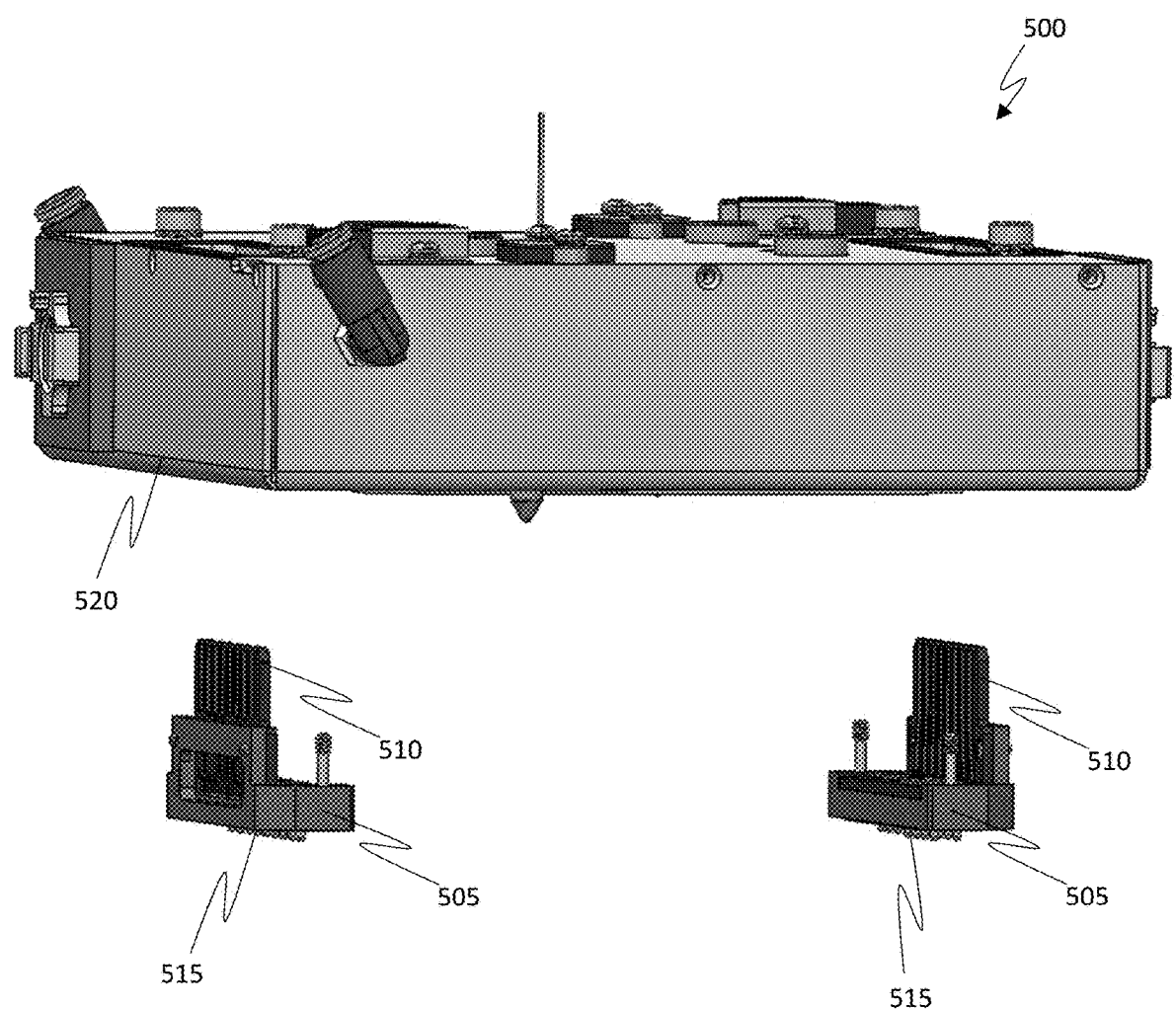
FIG. 5 depicts an exemplary thermal head with removeable pogo pin assemblies used to power heaters of an ATI for heating a device under test according to embodiments of the present invention.

FIG. 5 depicts an exemplary thermal head 500 with removable pin assemblies 505 used to power heaters of an ATI during high power device testing according to embodiments of the present invention. Removable pogo pin assemblies 505 can be easily removed from thermal head 500 without requiring disassembly of thermal head 500, thereby allowing for pin replacement in the field at a reduced cost compared to current approaches to ATI-based thermal management. Removable pogo pin assemblies 505 include pins 515 (e.g., pogo pints) used to power heaters of an ATI for heating a device under test according to embodiments of the present invention. The pogo pins 515 are electrically coupled to recessed pads of the ATI.

According to the embodiment depicted in FIG. 5, removable pin assemblies 505 include an edge connector 510 that is received by mating electrical housing (e.g., slots) of thermal head 500. The use of the edge connector 510 eliminates the need for any wiring connections and can be serviced easily from the accessible side of the cold plate 520. In this way, removable pin assemblies 505 can be easily removed and replaced without rendering testing equipment unusable for extended periods of time, which reduces operating costs and simplifies test equipment maintenance.

According to some embodiments, alignment and securing posts are disposed on the ATI and/or the thermal head 500 to align removeable pogo pin assemblies 505 with corresponding mating electrical housing. According to other embodiments, a cable with an accessible connector is attached to the pogo pin PCB. This implementation can be less expensive and uses less space, but may be harder to service in some cases.

Figure 6:
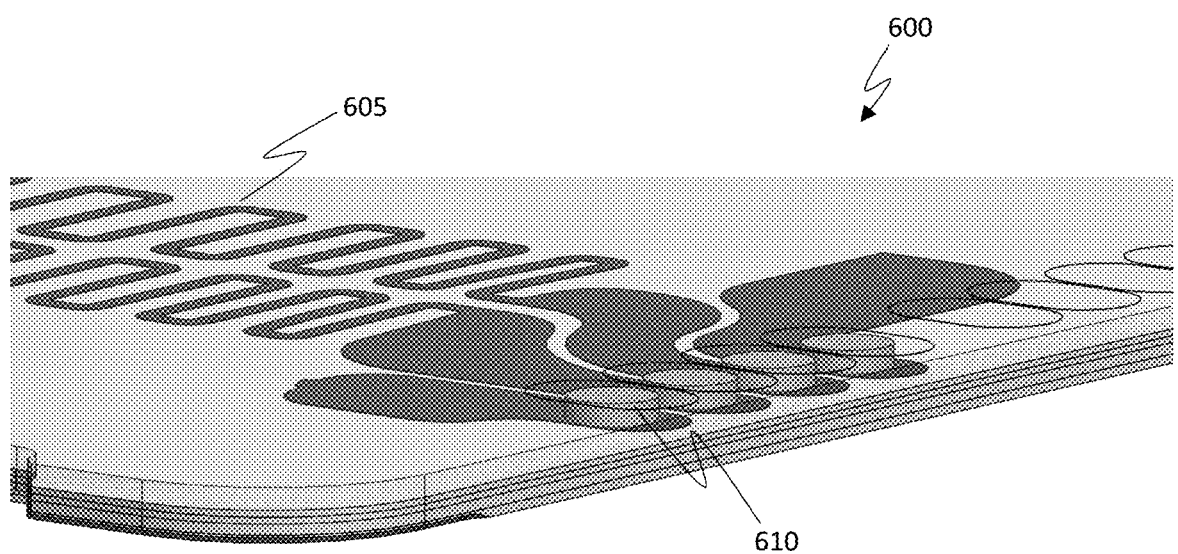
FIG. 6 depicts an exemplary pad disposed above tungsten traces of an ATI according to embodiments of the present invention.

With regard to FIG. 6, an exemplary pad 600 disposed above tungsten traces 605 of an ATI is depicted according to embodiments of the present invention. In the embodiment of FIG. 6, copper is disposed in the vias 610 below pad 600 while leaving the tungsten in place. Pad 600 is typically made from gold. Tungsten traces 605 are connected to the copper vias 610 in the HTCC ceramic. The copper vias increase conductivity and reduce resistance to advantageously prevent or mitigate the failure of the ATI pads due to burning during high power device testing. According to some embodiments, the vias are flooded with copper while the tungsten remains in the traces in the HTCC.

Figure 7:
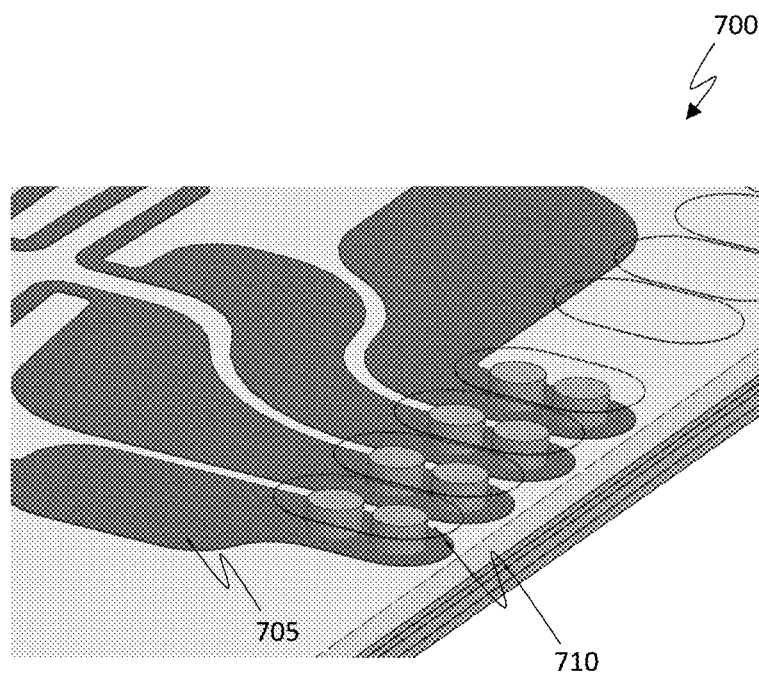
FIG. 7 depicts an exemplary pad of an ATI having multiple vias per trace according to embodiments of the present invention.

FIG. 7 depicts an exemplary pad 700 of an ATI having multiple vias per trace according to embodiments of the present invention. In the example of FIG. 7, each trace 705 is connected to two vias 710. The vias 710 can be coupled to a single pad or to multiple pads. The ATI can include multiple pads routed to the same trace and merged at different layers of the ceramic. Each via 710 receives approximately half the power compared to the single via implementation. In this way, the heat is spread out and the failure rate of the ATI pads due to burning is substantially reduced.

Figure 8A:
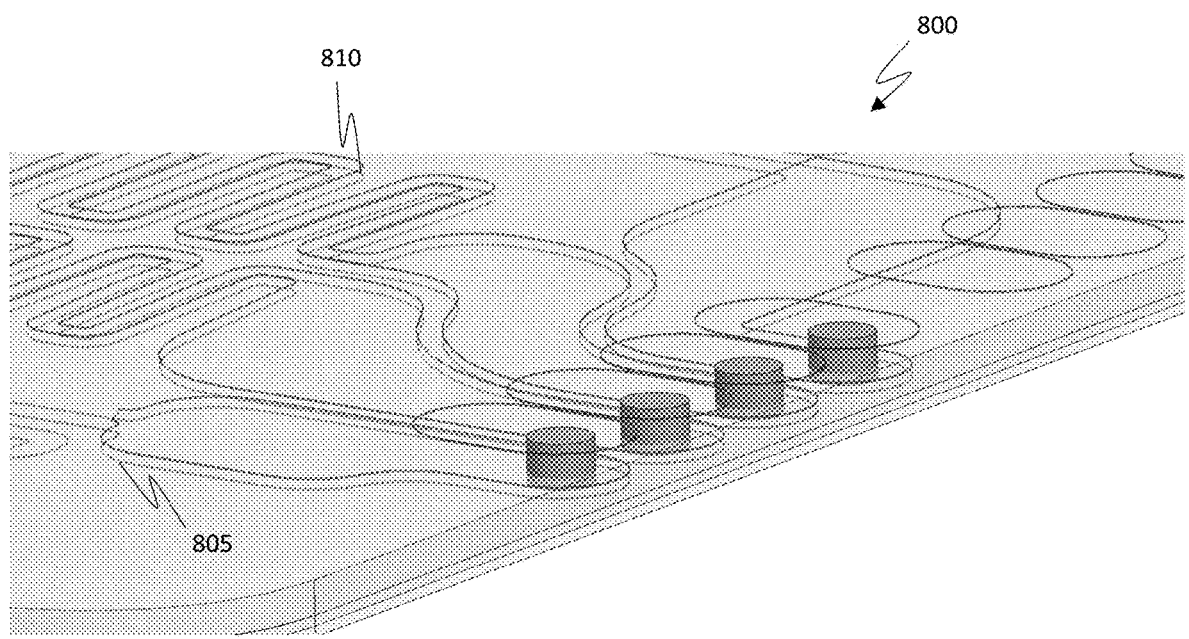
FIG. 8A depicts individual trace zones of pads of an exemplary ATI configured as low power zones according to embodiments of the present invention.

FIG. 8A depicts trace zones of pads of an exemplary ATI 800 configured as low power zones according to embodiments of the present invention. In the example of FIG. 8A, one high power zone of the ATI is split into two trace zones on two different layers. In this embodiment, pads 805 and 810 are connected using vias 815. By using multiple trace layers per heater at relatively low power, damage to the pads and pins is substantially reduced or prevented since the overall current is spread over multiple pads and vias of a plurality of heater elements for a common heater zone. According to some embodiments, additional trace zones are used in the heater, and the zones can be disposed on a common plane (e.g., pad). In the case as described herein where a single heater zone comprises multiple heater elements, a separate driving signal is required for each heater element.

Figure 8B:
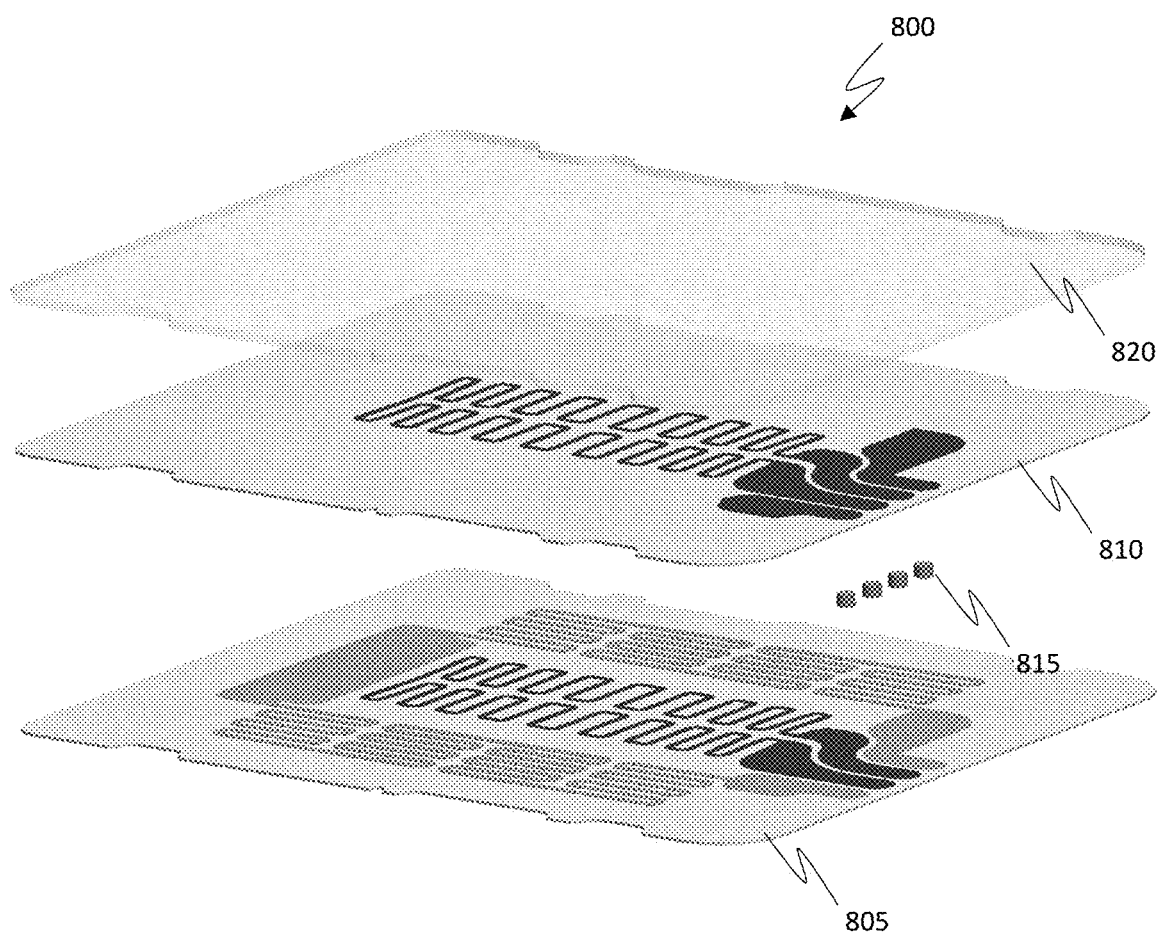
FIG. 8B shows pads of the exemplary ATI of FIG. 8A deconstructed for illustration purposes according to embodiments of the present invention.

FIG. 8B shows pads 805 and 810 deconstructed for purposes of illustration. Pads 805 and 810 and vias 815 are disposed under gold pad 820 and operate at the same temperature.

Figure 8C:
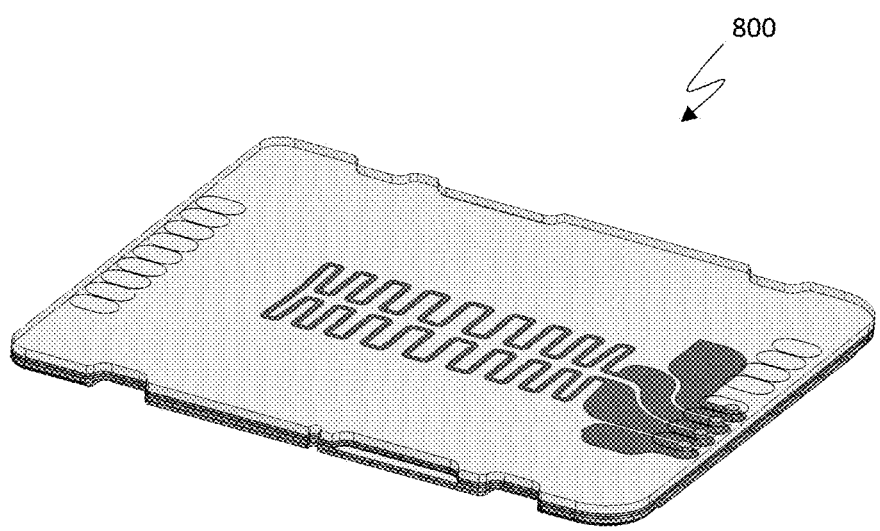
FIG. 8C shows pads of the exemplary ATI of FIG. 8A coupled using vias and covered by a gold pad for automated device testing according to embodiments of the present invention.

FIG. 8C shows ATI 800 with both pads 805 and 810 covered by gold pad 820 for automated device testing.

Exemplary Test System

Embodiments of the present invention are drawn to electronic systems for performing automated testing that substantially mitigates or reduces the failure rate of pin and pad interfaces of ATIs and thermal heads used during high power device testing. The following discussion describes one such exemplary electronic system or computer system that can be used as a platform for implementing embodiments of the present invention.

Figure 9:
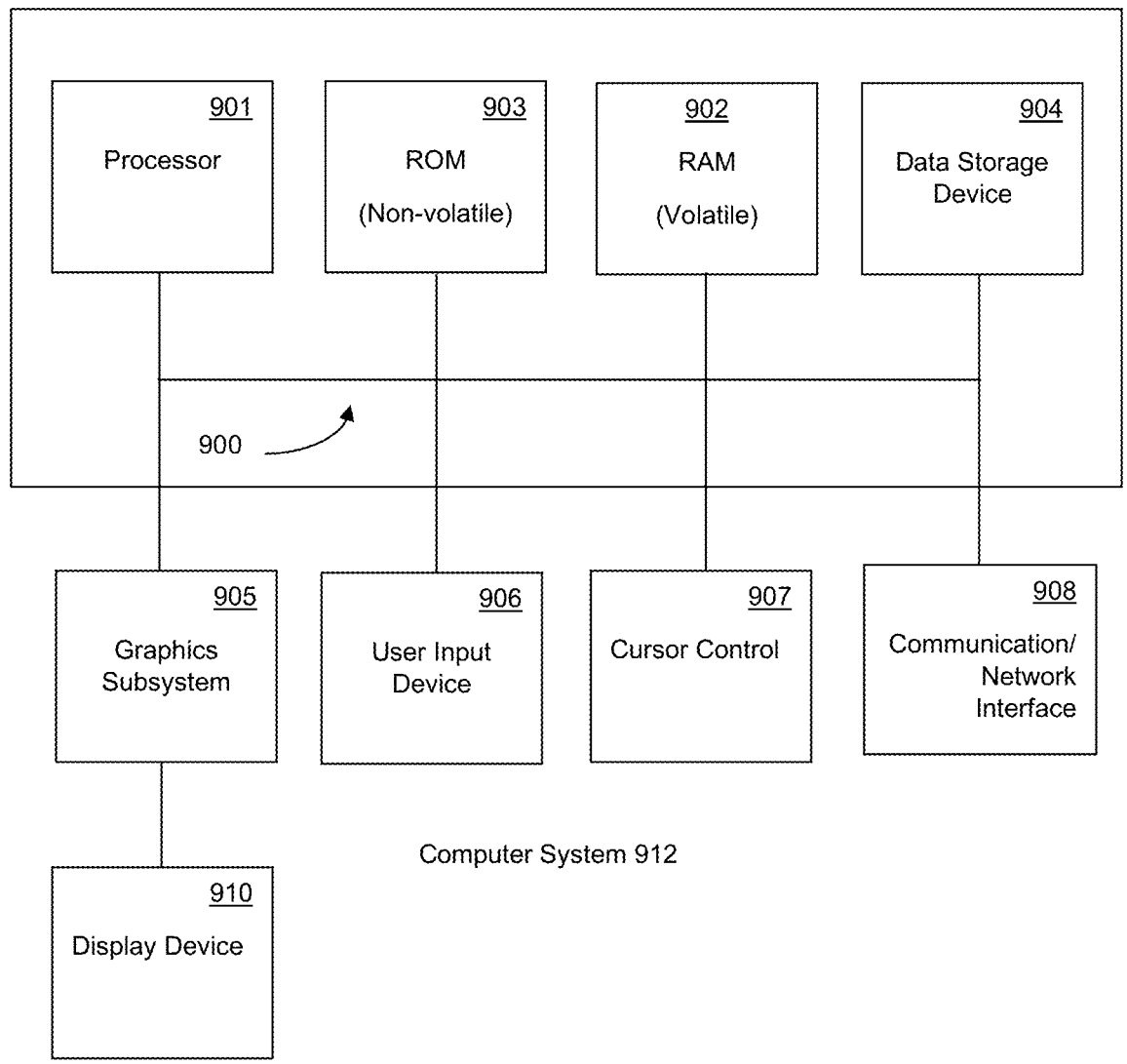
FIG. 9 is a block diagram of an exemplary computer system upon which embodiments of the present invention may be implemented.

In the example of FIG. 9, the exemplary computer system 912 (e.g., an agent system or supervisor system) includes a central processing unit (CPU) 901 for running software applications and optionally an operating system (e.g., a Linux or a Linux-based operating system). Random access memory 902 and read-only memory 903 store applications and data for use by the CPU 901. Data storage device 904 provides non-volatile storage for applications and data and may include fixed disk drives, removable disk drives, flash memory devices, and CD-ROM, DVD-ROM or other optical storage devices. The optional user inputs 906 and 907 comprise devices that communicate inputs from one or more users to the computer system 912 (e.g., mice, joysticks, cameras, touch screens, and/or microphones).

A communication or network interface 908 allows the computer system 912 to communicate with other computer systems, devices, networks, or devices via an electronic communications network, including wired and/or wireless communication such as USB or Bluetooth, and including an Intranet or the Internet (e.g., 802.11 wireless standard). The optional display device 910 may be any device capable of displaying visual information in response to a signal from the computer system 912 and may include a flat panel touch sensitive display, for example. The components of the computer system 912, including the CPU 901, memory 902/903, data storage 904, user input devices 906, and graphics subsystem 905 may be coupled via one or more data buses 900.

In the embodiment of FIG. 9, an optional graphics subsystem 905 may be coupled with the data bus and the components of the computer system 912. The graphics system may comprise a physical graphics processing unit (GPU) 905 and graphics/video memory. Graphics sub-system 905 outputs display data to optional display device 910. The display device 910 may be communicatively coupled to the graphics subsystem 905 using HDMI, DVI, DisplayPort, VGA, etc.

Embodiments of the present invention are thus described. While the present invention has been described in particular embodiments, it should be appreciated that the present invention should not be construed as limited by such embodiments, but rather construed according to the following claims.

What is claimed is:

1. An active thermal interposer (ATI) device for use in testing a device under test (DUT), said ATI device comprising:
a body layer having a first surface and a second surface, wherein said first surface is operable to be disposed adjacent to a cold plate of a thermal head and wherein said second surface is operable to be disposed adjacent to said DUT during testing thereof;
a plurality of heater elements disposed within said body layer;
a plurality of recessed pads disposed within recesses of said first surface of said body layer and wherein said plurality of recessed pads are electrically coupled to said plurality of heater elements; and
a plurality of copper discs disposed on top of, and in electrical contact with, said plurality of recessed pads within said recesses and aligned wherein said plurality of cooper discs remain recessed with respect to said first surface and wherein said plurality of copper discs is operable to contact a corresponding plurality of pins of said thermal head to receive driving electrical signals therefrom.

2. The ATI device of claim 1 wherein:
said plurality of heater elements comprise tungsten traces;
said plurality of recessed pads are gold;
said plurality of pins comprise pogo pins;
said plurality of copper discs functions to spread out heat and current with respect to said plurality of recessed pads; and
said body layer comprises ceramic material.

3. The ATI device of claim 1 wherein two or more copper discs of said plurality of copper discs are disposed on top of, and in electrical contact with, each recessed pad of said plurality of recessed pads and wherein said recesses are oval in shape.

4. The ATI device of claim 1 wherein one copper disc of said plurality of copper discs is disposed on top of, and in electrical contact with, each recessed pad of said plurality of recessed pads and wherein said recesses are circular in shape.

5. The ATI device of claim 1 wherein said plurality of copper discs are affixed to said plurality of recessed pads.

6. The ATI device of claim 1 wherein said plurality of copper discs are soldered to said plurality of recessed pads.

7. The ATI device of claim 1 wherein said plurality of recessed pads are electrically coupled to said plurality of heater elements using a plurality of via connections and wherein said plurality of via connections comprise tungsten vias.

8. The ATI device of claim 1 wherein said heater elements comprise high temperature co-fired ceramic (HTCC).

9. A thermal head for use in testing a device under test (DUT) that is in contact with an active thermal interposer (ATI) device, said thermal head comprising:

an exterior surface;
a cold plate for cooling said ATI device when said ATI device is in physical contact with said exterior surface, wherein said ATI device comprises a plurality of recessed pads disposed within recesses of a surface of said ATI device and wherein further said plurality of recessed pads are electrically coupled to a plurality of heater elements of said ATI device;
a plurality of pins disposed over said exterior surface and operable to make physical and electrical contact with said plurality of recessed pads when said ATI device is in said physical contact with said exterior surface, and wherein two or more pins of said plurality of pins correspond, respectively, to each pad of said plurality of recessed pads; and
circuits operable to drive electrical signals over said plurality of pins to energize said plurality of heater elements, wherein each heater element of said plurality of heater elements is energized by a common electrical signal driven over at least two or more pins.

10. The thermal head as described in claim 9 wherein, when said ATI device is in said physical contact with said exterior surface, each pad of said plurality of recessed pads makes physical and electrical contact with two or more pins of said plurality of pins.

11. The thermal head of claim 9 wherein said plurality of pins comprise pogo pins.

12. The ATI device of claim 9 wherein said plurality of heater elements comprises high temperature co-fired ceramic (HTCC).

13. A thermal head for use in testing a device under test (DUT) that is in contact with an active thermal interposer (ATI) device, said thermal head comprising:
an exterior surface comprising a mating electrical housing;
a cold plate for cooling said ATI device when said ATI device is in physical contact with said exterior surface, wherein said ATI device comprises a plurality of recessed pads disposed within recesses of a surface of said ATI device and wherein further said plurality of recessed pads are electrically coupled to a plurality of heater elements of said ATI device;
a removable pin assembly operable to be inserted within said mating electrical housing, said removable pin assembly comprising:
a body;
a card edge connector comprising a plurality of conductors and coupled to said body; and
a plurality of pins disposed over a surface of said body, said plurality of pins electrically coupled to said plurality of conductors and operable to make physical and electrical contact with said plurality of recessed pads when said ATI device is in said physical contact with said exterior surface; and
circuits operable to drive electrical signals over said plurality of conductors and said plurality of pins to energize said plurality of heater elements.

14. The thermal head of claim 13 wherein said plurality of pins comprise pogo pins.

15. The thermal head of claim 13 wherein, when said removable pin assembly is inserted into said mating electrical housing, said plurality of pins extend from, and are disposed across, said exterior surface.

16. The thermal head of claim 13 wherein said removable pin assembly further comprises alignment and securing posts disposed on said body, said alignment and securing posts for aligning said removable pin assembly with, and securing said removable pin assembly to, said mating electrical housing.

17. The thermal head of claim 13 wherein said removable pin assembly is replaceable to replace damaged pins.

18. An active thermal interposer (ATI) device for use in testing a device under test (DUT), said ATI device comprising:
a body layer having a first surface and a second surface, wherein said first surface is operable to be disposed adjacent to a cold plate of a thermal head and wherein said second surface is operable to be disposed adjacent to said DUT during testing thereof;
a plurality of heater elements disposed within said body layer;
a plurality of recessed pads disposed within recesses of said first surface of said body layer and wherein said plurality of recessed pads are electrically coupled to said plurality of heater elements; and
a plurality of conductive discs disposed on top of, and in electrical contact with, said plurality of recessed pads within said recesses and aligned wherein said plurality of conductive discs remain recessed with respect to said first surface and wherein said plurality of conductive discs is operable to contact a corresponding plurality of pins of said thermal head to receive driving electrical signals therefrom.

19. The ATI device of claim 18 wherein:
said plurality of heater elements comprise tungsten traces;
said plurality of recessed pads are gold;
said plurality of pins comprise pogo pins;
said plurality of conductive discs are gold and functions to spread out heat and current with respect to said plurality of recessed pads; and
said body layer comprises ceramic material.

20. The ATI device of claim 18 wherein two or more conductive discs of said plurality of conductive discs are disposed on top of, and in electrical contact with, each recessed pad of said plurality of recessed pads and wherein said recesses are oval in shape.

21. The ATI device of claim 18 wherein one conductive disc of said plurality of conductive discs is disposed on top of, and in electrical contact with, each recessed pad of said plurality of recessed pads and wherein said recesses are circular in shape.

22. The ATI device of claim 18 wherein said plurality of conductive discs are gold plated and affixed to said plurality of recessed pads.

23. The ATI device of claim 18 wherein said plurality of conductive discs comprise gold plated discs.

24. The ATI device of claim 18 wherein said plurality of recessed pads are electrically coupled to said plurality of heater elements using a plurality of via connections, wherein said plurality of via connections comprise tungsten vias and wherein further said plurality of conductive discs comprise gold discs.

25. The ATI device of claim 18 wherein said heater elements comprise high temperature co-fired ceramic (HTCC).

26. The ATI device of claim 18 wherein said plurality of conductive discs comprise gold discs.

\* \* \* \* \*